(12) United States Patent
Lee et al.

(10) Patent No.: US 12,094,762 B2
(45) Date of Patent: Sep. 17, 2024

(54) METHOD OF MANUFACTURING SEMICONDUCTOR DEVICE

(71) Applicant: SK hynix Inc., Icheon-si (KR)

(72) Inventors: Dong Hun Lee, Icheon-si (KR); Jeong Hwan Kim, Icheon-si (KR); Mi Seong Park, Icheon-si (KR); Jung Shik Jang, Icheon-si (KR); Won Geun Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/450,255

(22) Filed: Aug. 15, 2023

(65) Prior Publication Data

US 2023/0395424 A1 Dec. 7, 2023

Related U.S. Application Data

(63) Continuation of application No. 17/345,926, filed on Jun. 11, 2021, now Pat. No. 11,769,689.

(30) Foreign Application Priority Data

Dec. 1, 2020 (KR) .......................... 10-2020-0166037

(51) Int. Cl.
*H01L 21/68* (2006.01)
*H01L 21/768* (2006.01)

(52) U.S. Cl.
CPC .. *H01L 21/76802* (2013.01); *H01L 21/76838* (2013.01)

(58) Field of Classification Search
CPC ........ H01L 21/76802; H01L 21/76838; H10B 43/27; H10B 43/50; H10B 43/10; H10B 99/00; H10B 41/20; H10B 41/30; H10B 43/30; H10B 43/20
See application file for complete search history.

(56) References Cited

U.S. PATENT DOCUMENTS 9,165,823 B2 * 10/2015 Chen ................. H01L 21/76838
9,446,531 B2    9/2016 Mathues et al.
9,466,531 B2 * 10/2016 Freeman ........... H01L 21/76892

FOREIGN PATENT DOCUMENTS

| KR | 1020170014757 A | 2/2017 |
| KR | 1020170124378 A | 11/2017 |
| KR | 1020180001301 A | 1/2018 |
| KR | 1020190133326 A | 12/2019 |

* cited by examiner

*Primary Examiner* — Karen Kusumakar
(74) *Attorney, Agent, or Firm* — WILLIAM PARK & ASSOCIATES LTD.

(57) ABSTRACT

A method of manufacturing a semiconductor device is provided. The method may include forming a stack, forming a preliminary stepped structure by patterning the stack, forming a first stepped structure, a second stepped structure, and an opening located between the first stepped structure and the second stepped structure by etching the preliminary stepped structure, forming a passivation layer that fills the opening and covers the first stepped structure, and forming a third stepped structure by etching the second stepped structure using the passivation layer as an etching barrier.

8 Claims, 32 Drawing Sheets

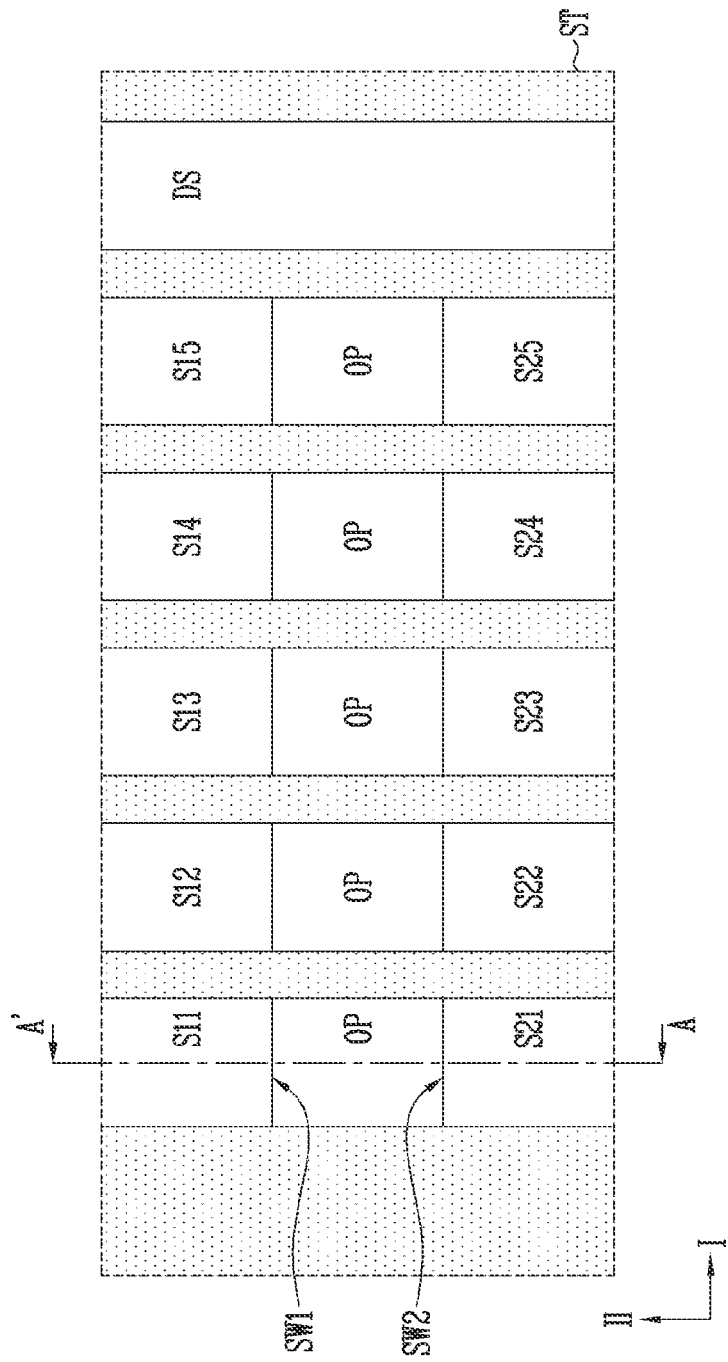

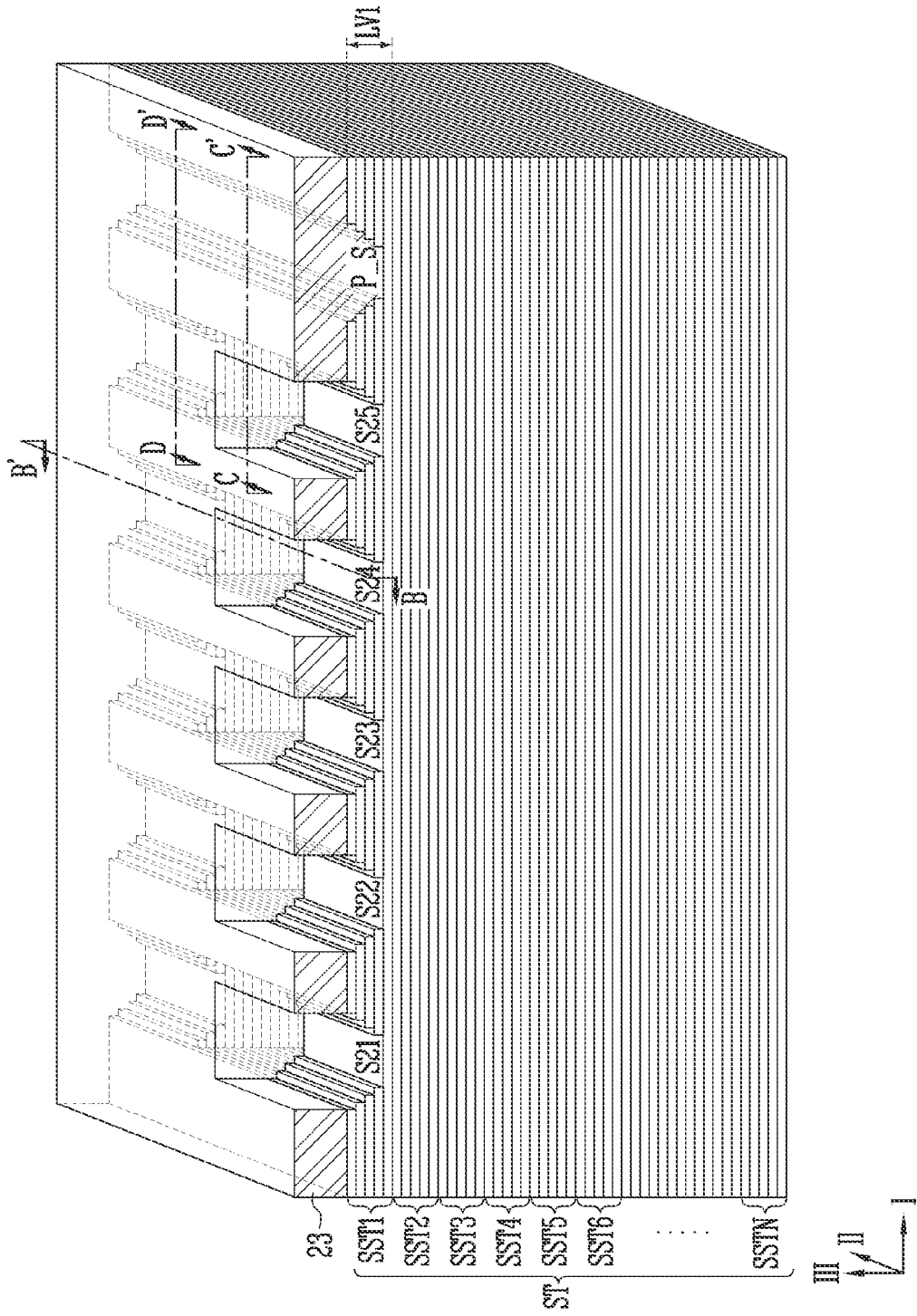

METHOD OF MANUFACTURING SEMICONDUCTOR DEVICE

CROSS-REFERENCE TO RELATED APPLICATION

The present application is a continuation application of U.S. patent application Ser. No. 17/345,926, filed on Jun. 11, 2021, and claims priority under 35 U.S.C. § 119(a) to Korean patent application number 10-2020-0166037 filed on Dec. 1, 2020, in the Korean Intellectual Property Office, the entire disclosure of which is incorporated by reference herein.

BACKGROUND

1. Technical Field

Various embodiments of the present disclosure generally relate to an electronic device, and more particularly, to a method of manufacturing a semiconductor device.

2. Related Art

The integration of a semiconductor device is mainly determined by an area occupied by a unit memory cell. Recently, as the improvement of the integration of the semiconductor device including memory cells formed on a substrate in a single layer is limited, a three-dimensional semiconductor device including memory cells stacked on a substrate has been proposed. Furthermore, in order to improve the operational reliability of such a semiconductor device, various structures and manufacturing methods have been developed.

SUMMARY

An embodiment of the present disclosure may provide for a method of manufacturing a semiconductor device, including forming a stack; forming a preliminary stepped structure by patterning the stack; forming a first stepped structure, a second stepped structure, and an opening located between the first stepped structure and the second stepped structure by etching the preliminary stepped structure; forming a passivation layer that fills the opening and covers the first stepped structure; and forming a third stepped structure by etching the second stepped structure using the passivation layer as an etching barrier.

An embodiment of the present disclosure may provide for a method of manufacturing a semiconductor device, including forming a stack including a first stepped structure and a second stepped structure; forming an opening that passes through the stack and defines a first sidewall including a sidewall of the first stepped structure, and a second sidewall including a sidewall of the second stepped structure; forming a passivation layer covering the first sidewall on the stack; and forming a third stepped structure by etching the second stepped structure using the passivation layer as an etching barrier.

BRIEF DESCRIPTION OF THE DRAWINGS

FIGS. 1A, 1B, and 1C are diagrams illustrating the structure of a semiconductor device in accordance with an embodiment of the present disclosure.

DETAILED DESCRIPTION

Various embodiments of the present disclosure are directed to a method of manufacturing a semiconductor device which has a stable structure and improved characteristics.

Specific structural or functional descriptions in the embodiments of the present disclosure introduced in this specification or application are only for description of the embodiments of the present disclosure. The descriptions should not be construed as being limited to the embodiments described in the specification or application.

Figure 1A:
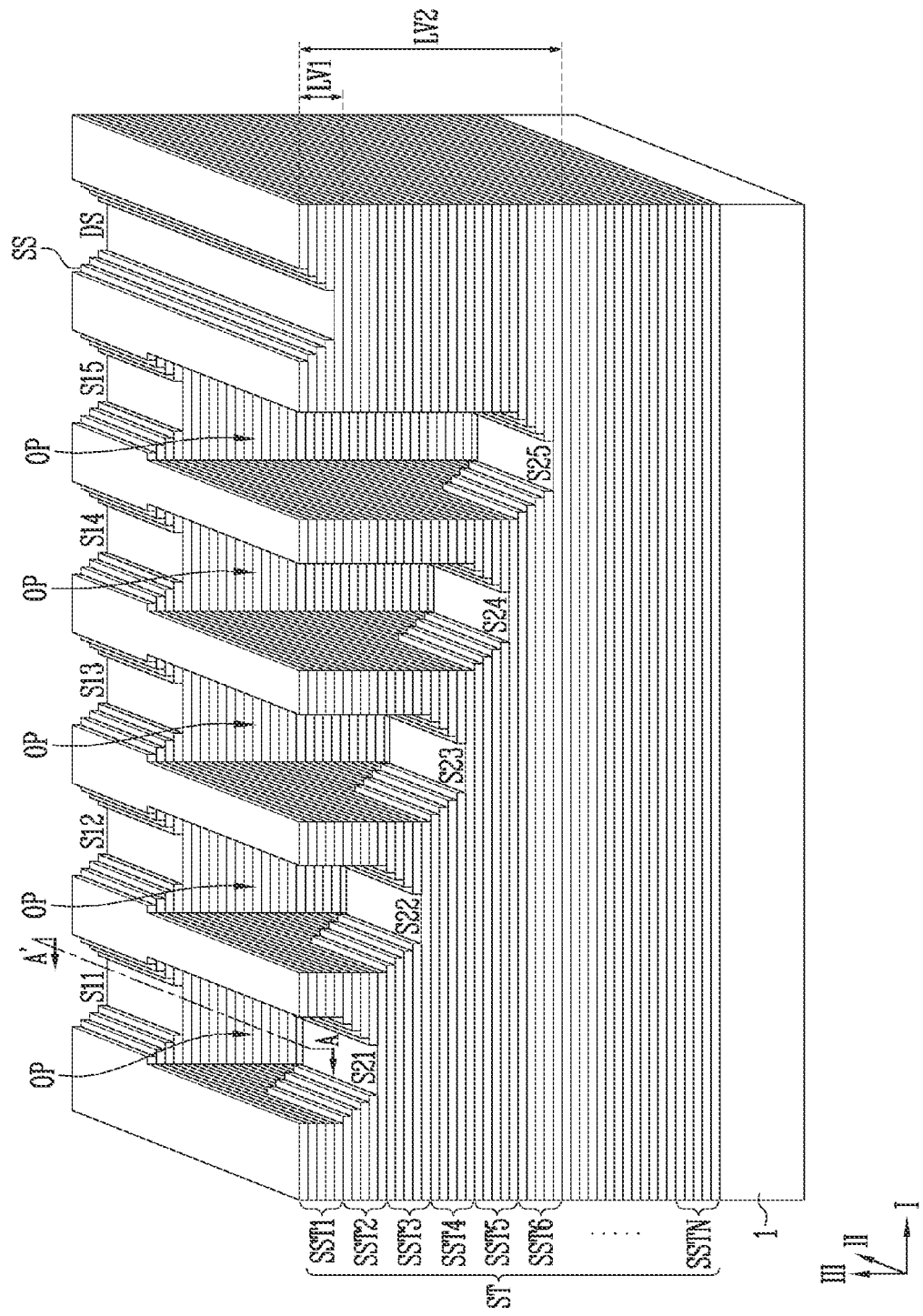
Figure 1C:
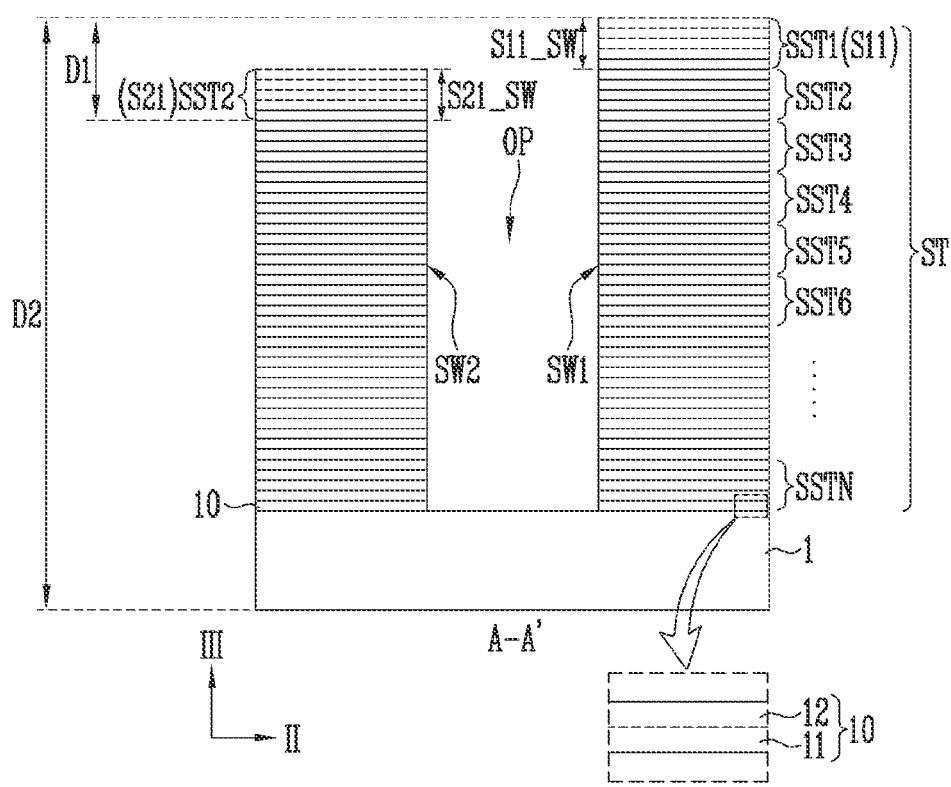

FIGS. 1A, 1B, and 1C are diagrams illustrating the structure of a semiconductor device in accordance with an embodiment of the present disclosure.

Referring to FIGS. 1A, 1B, and 1C, the semiconductor device may include a lower structure 1 and a stack ST. The lower structure 1 may include a substrate, a peripheral circuit, an interconnection, a source structure, and the like. The peripheral circuit may be a circuit for driving a memory string. The peripheral circuit may include a capacitor, a resistor, a transistor, a switch, a decoder, a sense amplifier, etc. The interconnection may include a contact plug, a line, or the like. The source structure may include a conductive material such as polysilicon or metal.

The stack ST may be located on the lower structure 1. The stack ST may include first to N-th sub-stacks SST1 to SSTN, wherein N may be an integer of 2 or more. The first to N-th sub-stacks SST1 to SSTN may be stacked in a third direction III. A plane may be defined by a first direction I and a second direction II intersecting with the first direction I, and the third direction III may be a direction protruding from the plane. In an embodiment, the N-th to first stacks SSTN to SST1 may be sequentially stacked on the lower structure 1.

The stack ST may include stepped structures S11 to S15 and S21 to S25, wherein the stepped structures S11 to S15 and S21 to S25 may be arranged in the first direction I and the second direction II intersecting with the first direction I. The first sub-stack SST1 may include the first stepped structures S11 to S15, wherein the first stepped structures S11 to S15 may be arranged in the first direction I. The second to sixth sub-stacks SST2 to SST6 may include second stepped structures S21 to S25, respectively. Although not shown in the drawings, the seventh to N-th sub-stacks SST7 to SSTN may also include stepped structures, respectively.

The second stepped structures S21 to S25 may be arranged in the first direction I, in the second direction II, or in both the first direction I and the second direction II. In an embodiment, the second stepped structures S21 to S25 may be arranged in the first direction I. The second stepped structures S21 to S25 may be adjacent to the first stepped structures S11 to S15 in the second direction II.

The first stepped structures S11 to S15 may be located at a first level LV1, wherein the first stepped structures S11 to S15 may be located at substantially the same level. The second stepped structures S21 to S25 may be located at a second level LV2. The second level LV2 may be located lower than the first level LV1. The second stepped structures S21 to S25 may be located at different levels within the second level LV2.

Each of the stepped structures S11 to S15 and S21 to S25 may include at least one stepped surface SS that rises or falls in the first direction I or the second direction II. In an embodiment, one stepped structure S11 to S15 and S21 to S25 may include stepped surfaces SS facing in the first direction I. The stepped surfaces SS facing in the first direction I may have a symmetrical shape or an asymmetrical shape.

The stack ST may include stacked layers 10. At least one layer 10 may form one step, and each of the layers 10 may include at least one conductive layer 11 and at least one insulating layer 12. In an embodiment, the stack ST may include conductive layers 11 and insulating layers 12 which are alternately stacked. The conductive layers 11 may be gate electrodes such as a memory cell or a select transistor. The conductive layers 11 may include a conductive material such as polysilicon, tungsten, molybdenum, or metal. The insulating layers 12 serve to insulate the stacked conductive layers 11 from each other. The insulating layers 12 may include insulating material such as oxide, nitride, or an air gap.

The stack ST may further include a dummy stepped structure DS. The first sub-stack SST1 may include a dummy stepped structure DS, wherein the dummy stepped structure DS may have a longer length in the second direction II than the first stepped structures S11 to S15 or the second stepped structures S21 to S25.

The semiconductor device may further include an opening OP. The opening OP may pass through the stack ST in the third direction III. The opening OP may be located between the pair of first stepped structures S11 to S15 and second stepped structures S21 to S25. In an embodiment, the opening OP may pass through the stack ST between the first stepped structures S11 to S15 and the second stepped structures S21 to S25 facing in the second direction II.

Referring to FIG. 1C, a first sidewall SW1 and a second sidewall SW2 may be defined by the opening OP. The first sidewall SW1 and the second sidewall SW2 may face each other in the second direction II. The first sidewall SW1 may include a sidewall S11_SW of the first stepped structure, and may extend in the third direction III from the sidewall S11_SW of the first stepped structure. The second sidewall SW2 may include a sidewall S2_SW of the second stepped structure, and may extend in the third direction III from the sidewall S2_SW of the second stepped structure.

The first sidewall SW1 and the second sidewall SW2 may be etched surfaces formed in a process of etching the stack ST to form the opening OP. The first sidewall SW1 or the second sidewall SW2 may have a substantially flat profile. The first sidewall SW1 or the second sidewall SW2 may not include an uneven surface such as an undercut. In an embodiment, the first sidewall SW1 or the second sidewall SW2 may be perpendicular to an upper surface of the stack ST.

The opening OP may completely or partially pass through the stack ST. The opening OP may have at least a first depth D1. The first depth D1 may be a depth exposing the sidewall of the first stepped structure S11 and the sidewall of the second stepped structure S21 positioned on opposite sides of the opening OP. In an embodiment, the opening OP may have a depth passing through the first level LV1 and the second level LV2 of the stack ST (see FIG. 1A). The opening OP may have a second depth D2. The opening OP of the second depth D2 may completely pass through the stack ST to expose the lower structure 1.

In the above-described structure, the first sidewall SW1 and the second sidewall SW2 may have a substantially flat profile by the opening OP. Since the first sidewall SW1 and the second sidewall SW2 do not include the uneven surface such as the undercut, an advantage of the present disclosure is that it may be possible to prevent the area of the stepped structure from being increased due to the uneven surface.

Figure 2:
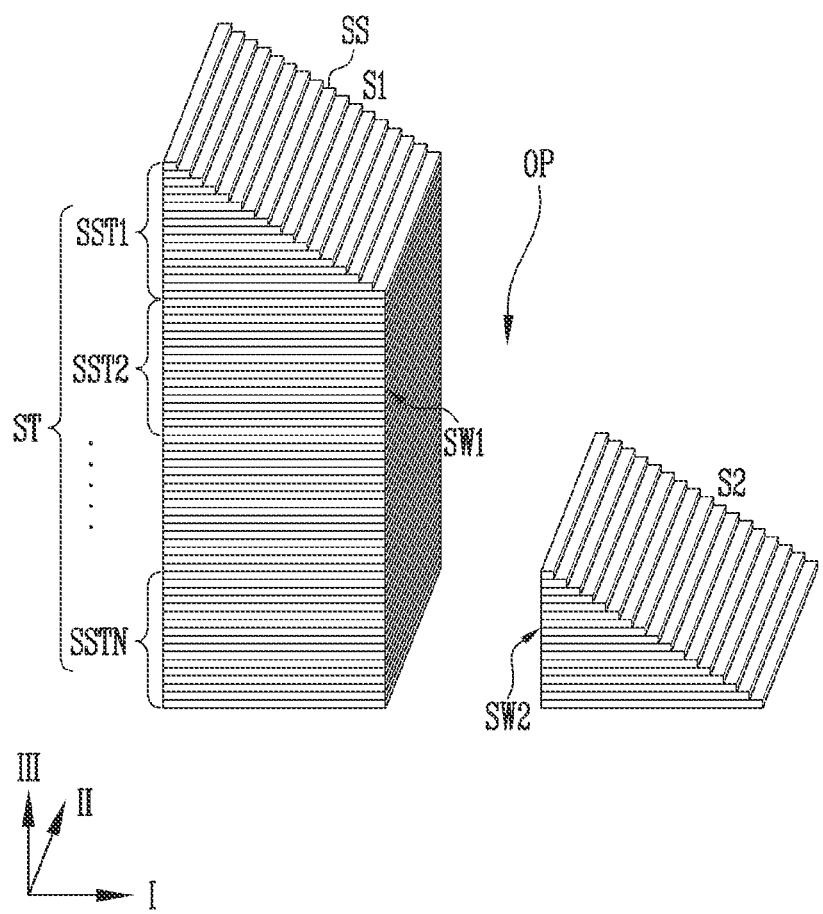
FIG. 2 is a diagram illustrating the structure of a semiconductor device in accordance with an embodiment of the present disclosure.
Figure 3A:
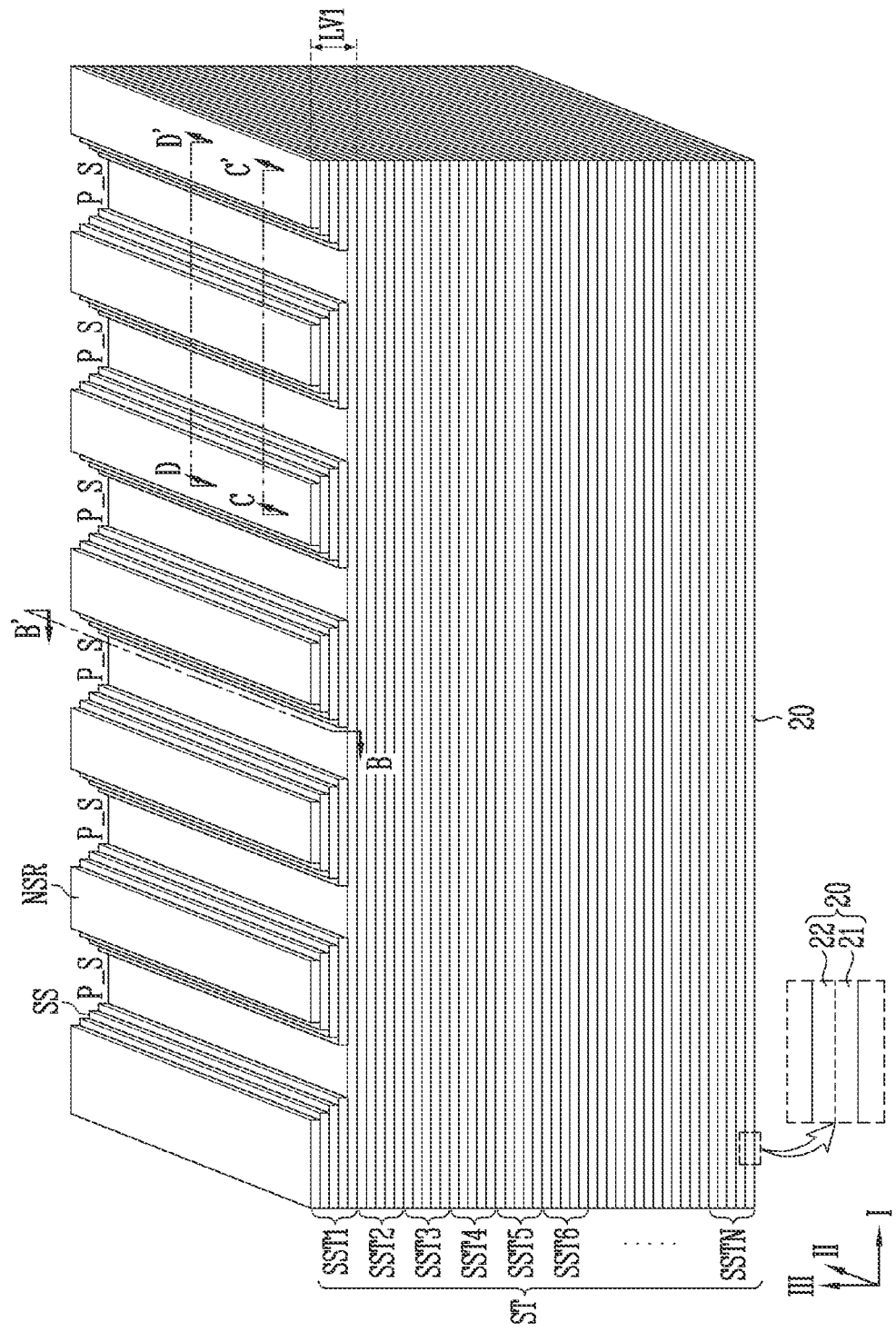
FIGS. 3A, 3B, 3C, and 3D, FIGS. 4A, 4B, 4C, and 4D, FIGS. 5A, 5C, and 5D, FIGS. 6A, 6B, 6C, and 6D, and FIGS. 7A, 7B, 7C, and 7D are diagrams illustrating a method of manufacturing a semiconductor device in accordance with an embodiment of the present disclosure.
Figure 3B:
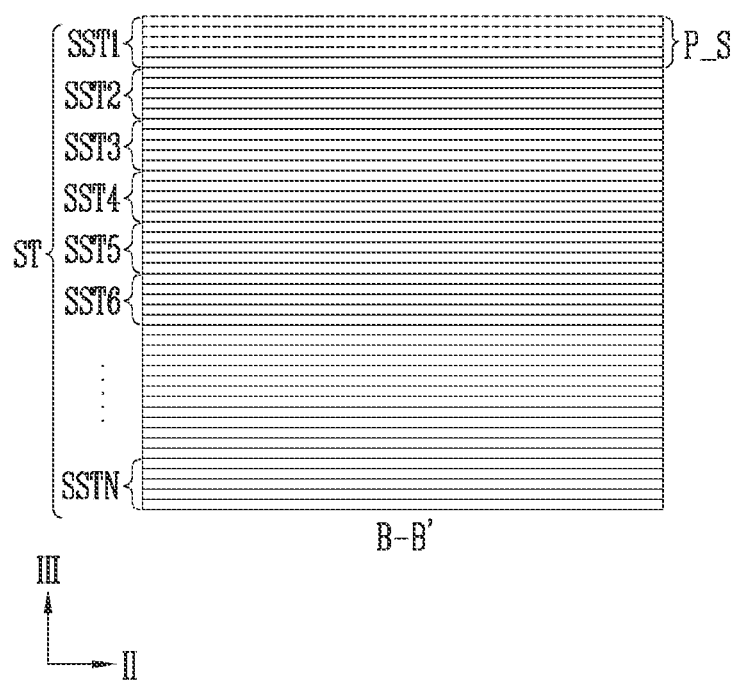
Figure 3C:
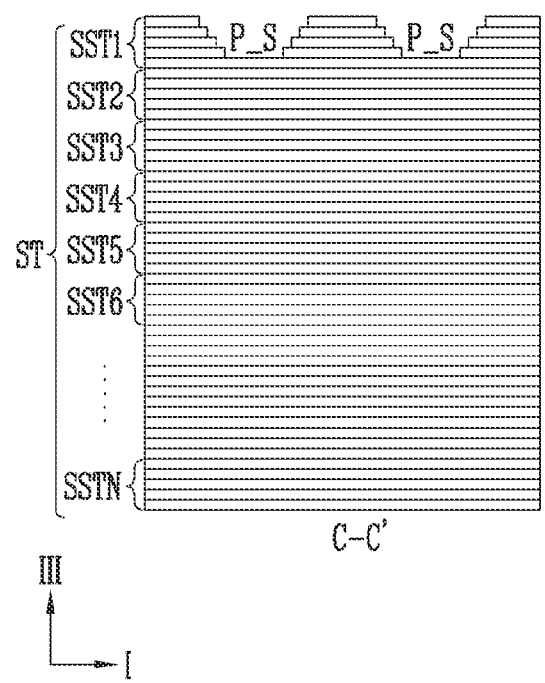
Figure 3D:
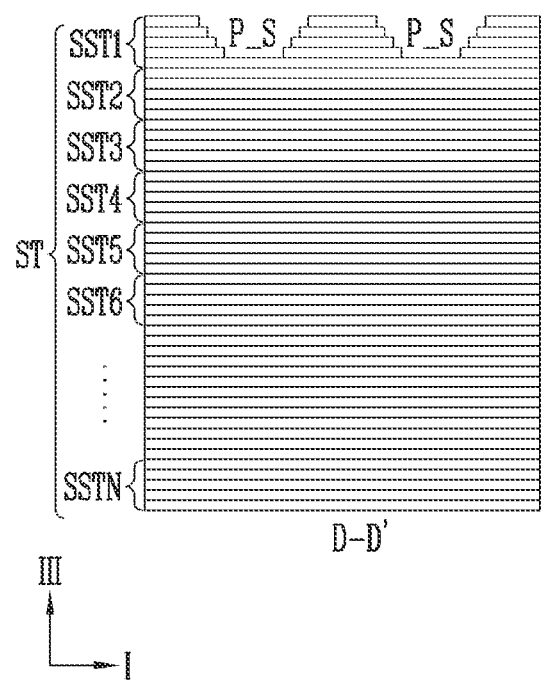
Figure 4A:
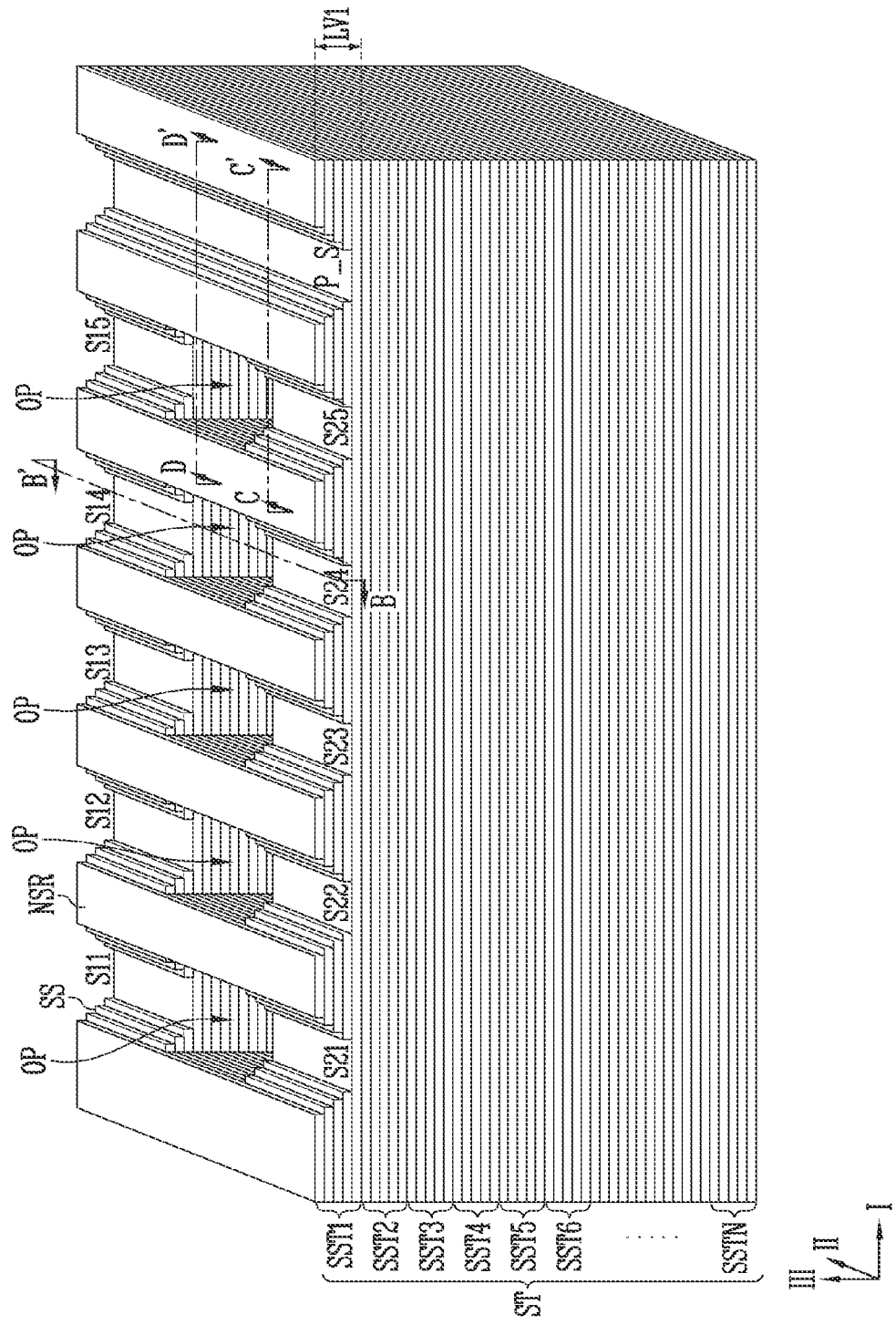
Figure 4B:
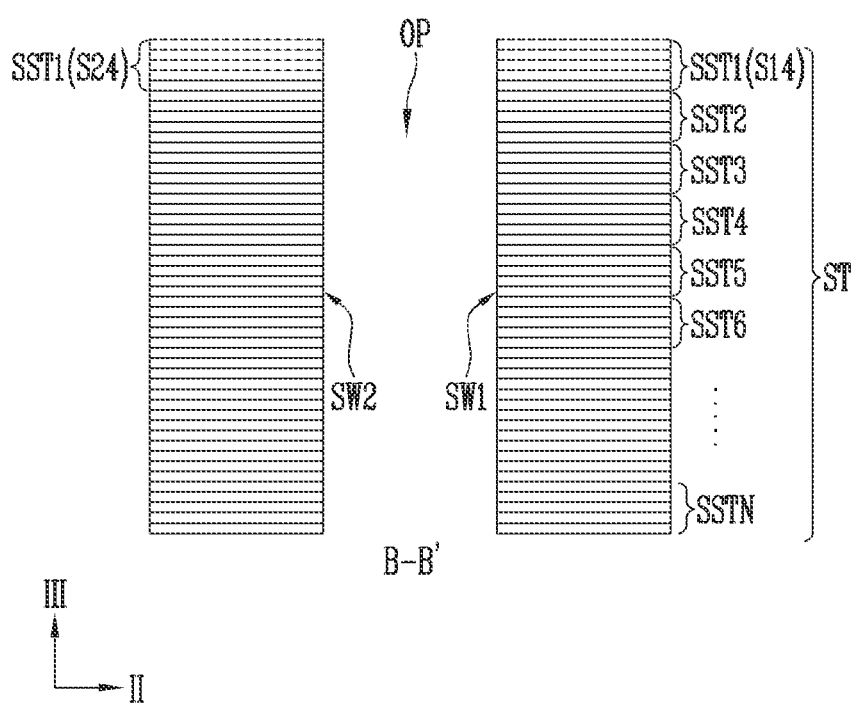
Figure 4C:
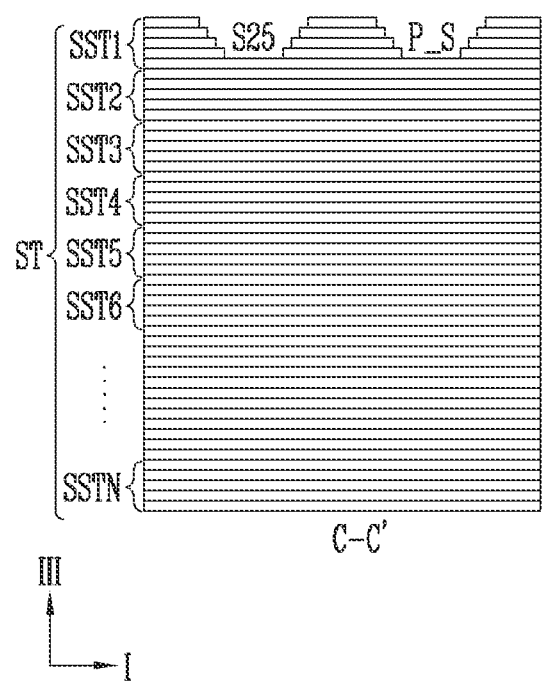
Figure 4D:
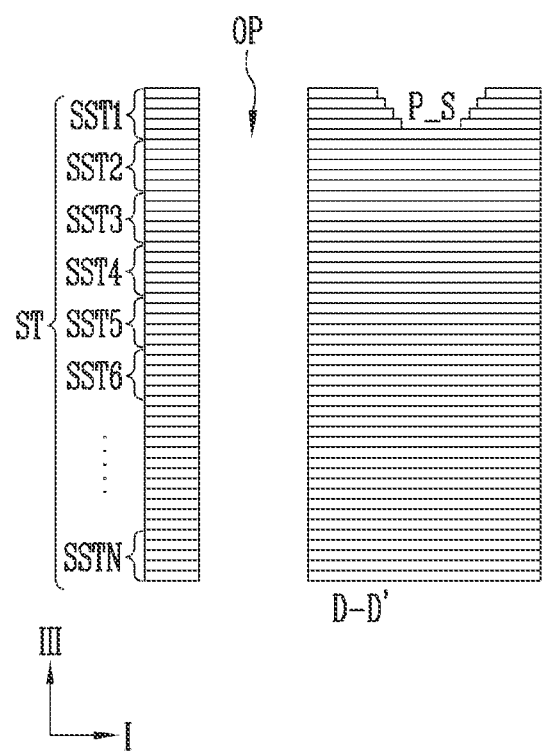
Figure 5B:
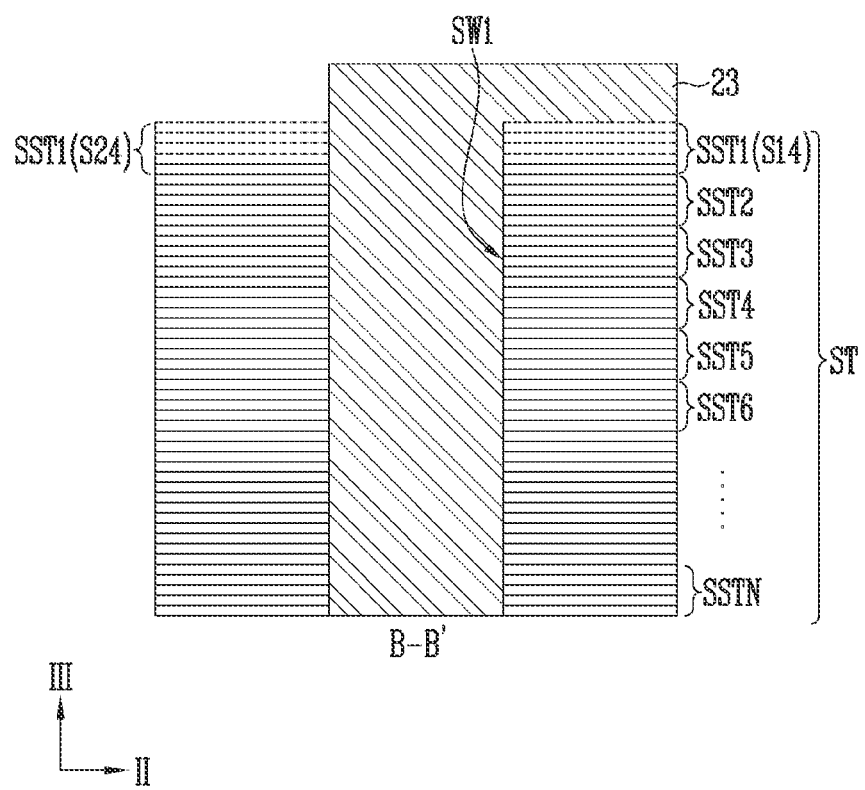
Figure 5C:
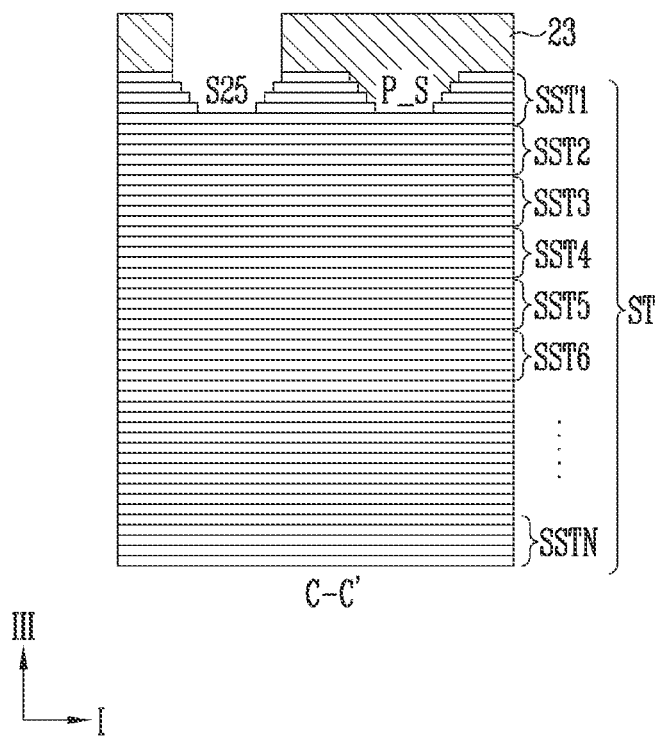
Figure 5D:
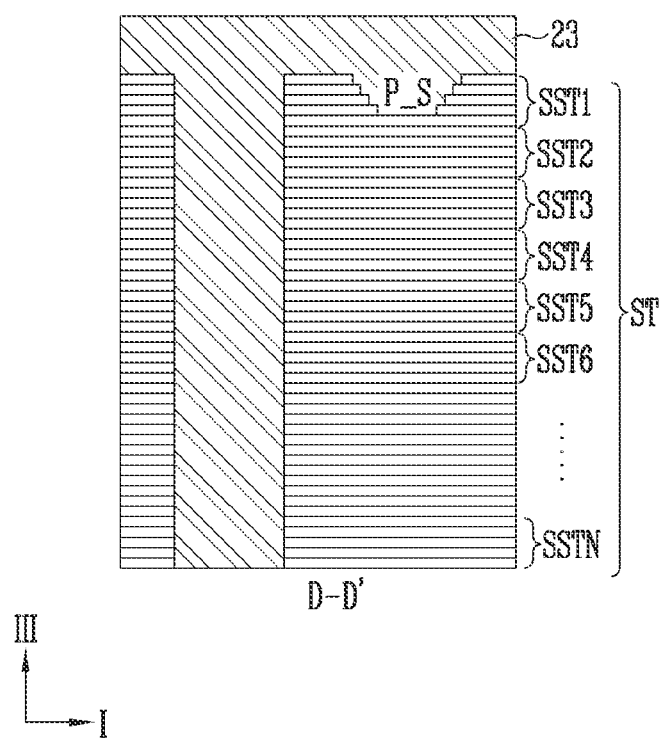
Figure 6A:
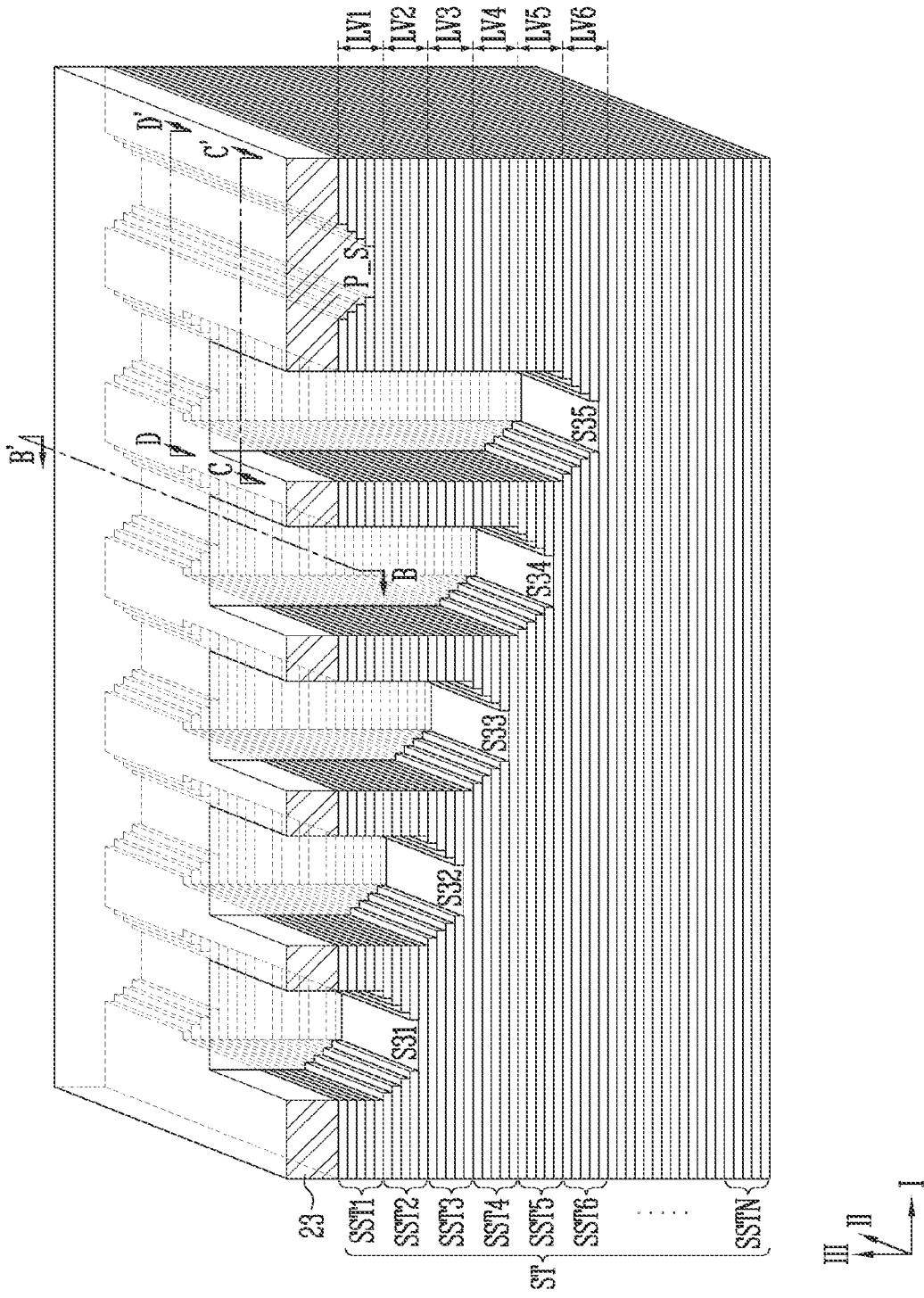
Figure 6B:
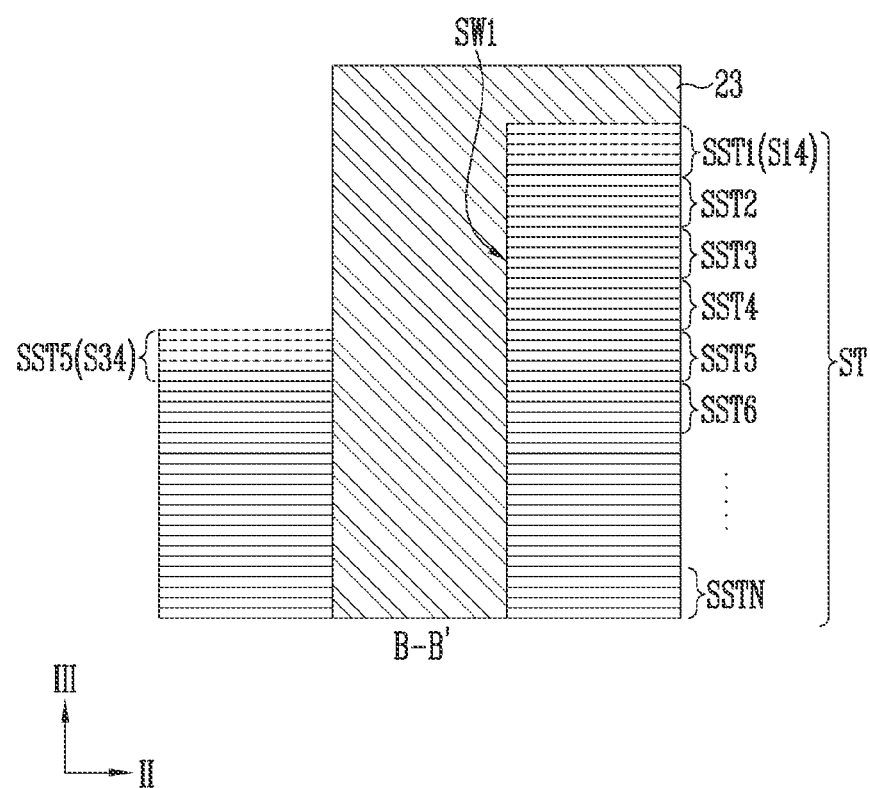
Figure 6C:
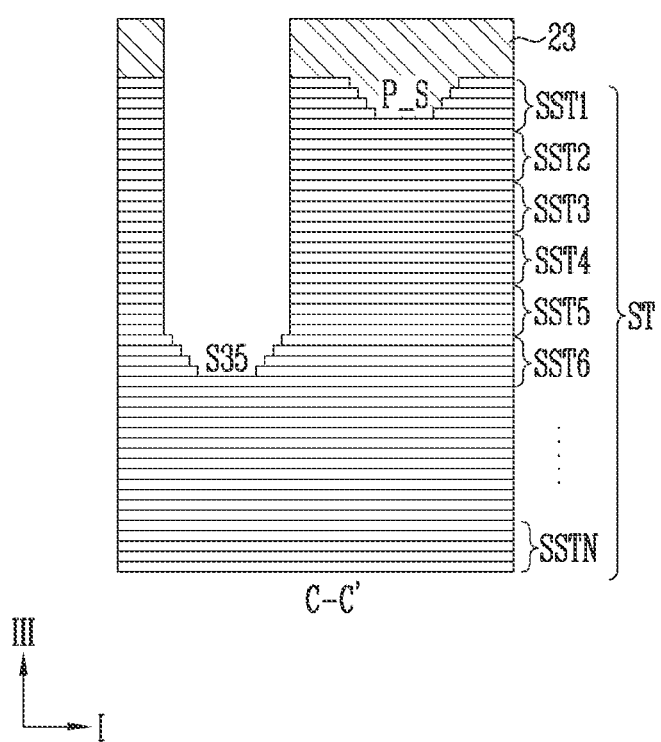
Figure 6D:
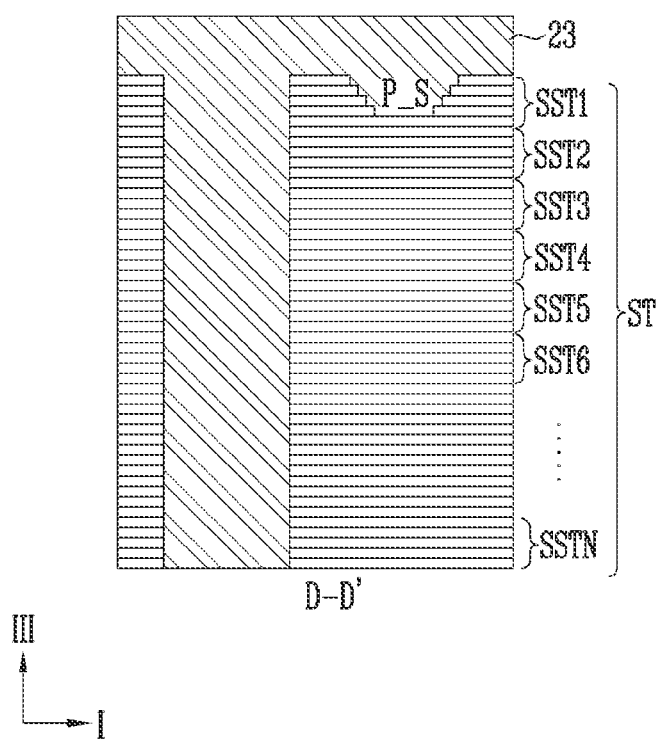
Figure 7A:
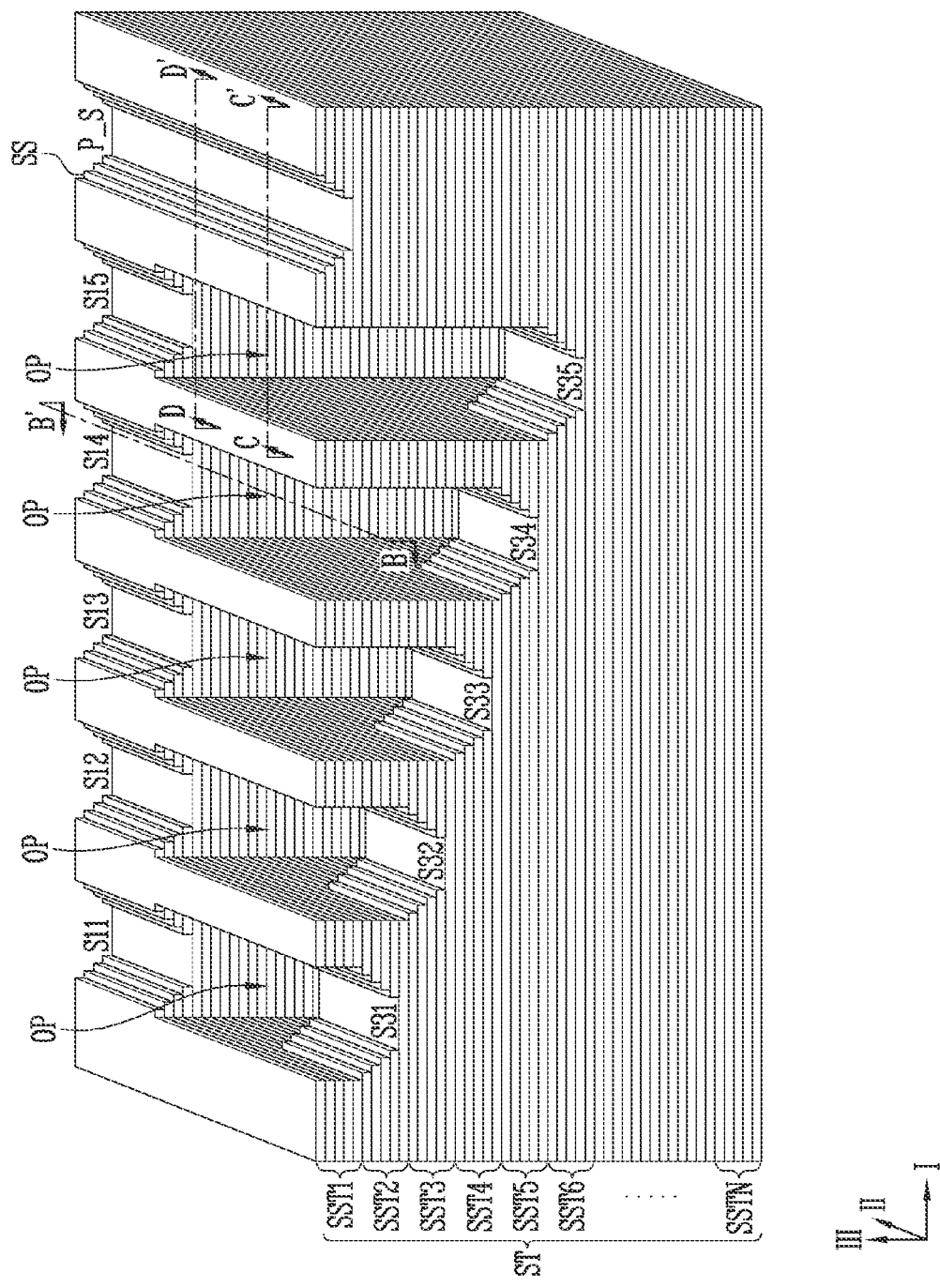
Figure 7B:
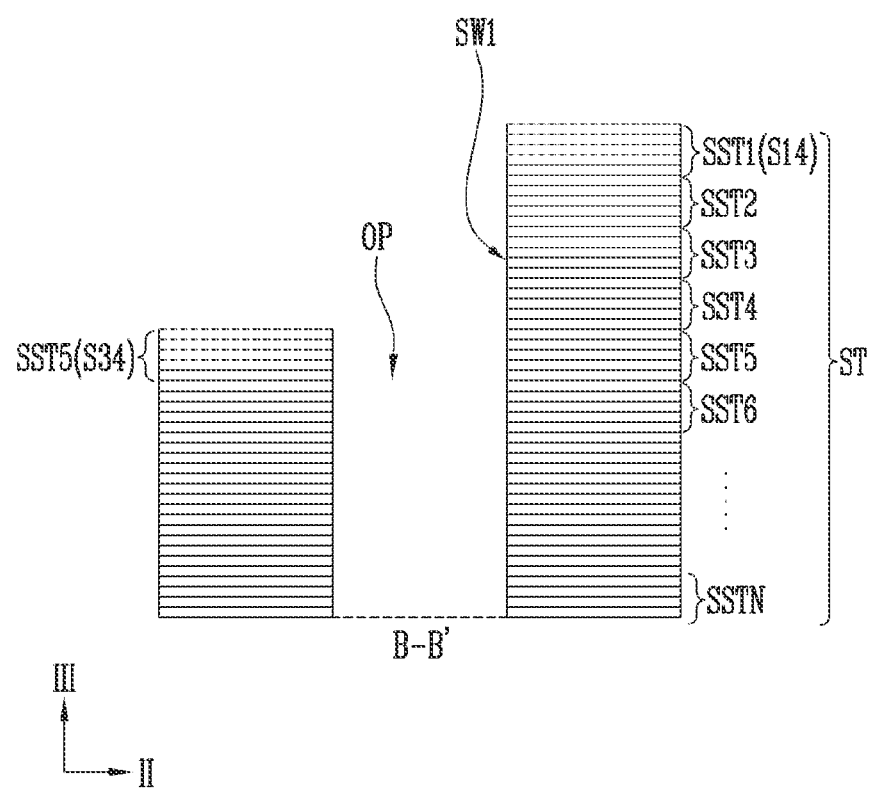
Figure 7C:
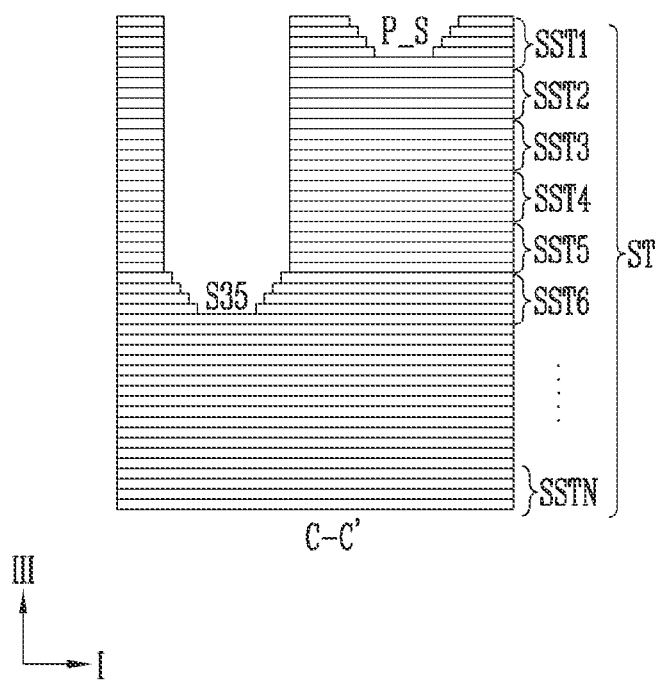
Figure 7D:
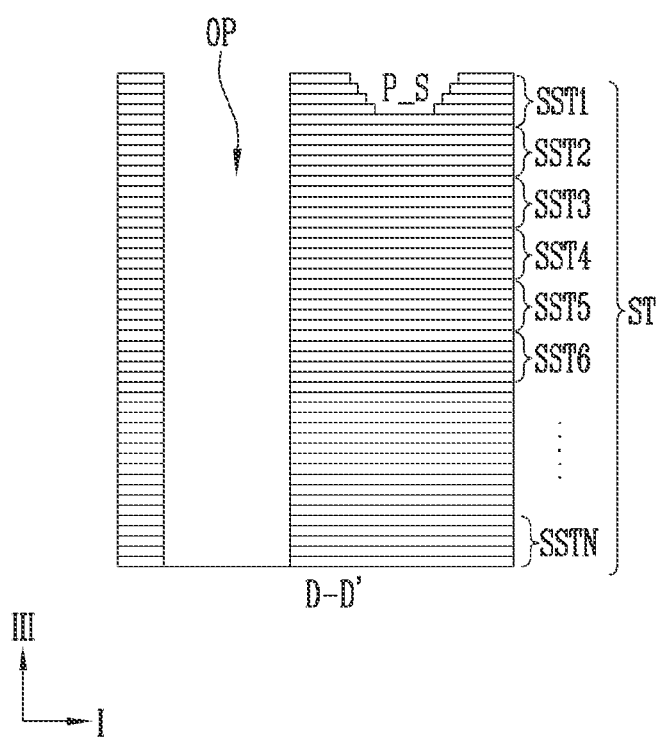

FIG. 2 is a diagram illustrating the structure of a semiconductor device in accordance with an embodiment of the present disclosure. Hereinbelow, repetitive explanation will be omitted if deemed redundant.

Referring to FIG. 2, the semiconductor device may include a stack ST. The stack ST may include first to N-th sub-stacks SST1 to SSTN. The stack ST may include a first stepped structure S1 and a second stepped structure S2.

The first stepped structure S1 and the second stepped structure S2 may be located at different levels. In an embodiment, the first stepped structure S1 may be formed on the first sub-stack SST1, and the second stepped structure S2 may be formed on the sub-stack of one of the second to N-th stepped structures SST2 to SSTN.

The first and second stepped structures S1 and S2 may be adjacent to each other in the first direction I. Each of the first and second stepped structures S1 and S2 may include a stepped surface SS rising or falling in the first direction I.

The semiconductor device may further include an opening OP, wherein the opening OP may pass through the stack ST in the third direction III. The opening OP may be positioned between the first stepped structures S1 and the second stepped structure S2. In an embodiment, the opening OP may pass through the stack ST between the first stepped structure S1 and the second stepped structure S2 facing in the first direction I.

A first sidewall SW1 and a second sidewall SW2 may be defined by the opening OP. The first sidewall SW1 and the second sidewall SW2 may face each other in the first direction I. The first sidewall SW1 may include a sidewall of the first stepped structure S1, and may extend in the third direction III from the sidewall of the first stepped structure S1. The second sidewall SW2 may include a sidewall of the second stepped structure S2, and may extend in the third direction III from the sidewall of the second stepped structure S2. The first sidewall SW1 and the second sidewall SW2 may be etched surfaces formed when the opening OP is formed. The first sidewall SW1 or the second sidewall SW2 may have a flat profile. The opening OP may completely or partially pass through the stack ST.

In the above-described structure, the first sidewall SW1 and the second sidewall SW2 may have a substantially flat profile by the opening OP. Since the first sidewall SW1 and the second sidewall SW2 do not include the uneven surface such as the undercut, It is an advantage of the present disclosure that it may be possible to prevent the area of the stepped structure from being increased due to the uneven surface.

FIGS. 3A, 3B, 3C, and 3D, FIGS. 4A, 4B, 4C, and 4D, FIGS. 5A, 5C, and 5D, FIGS. 6A, 6B, 6C, and 6D, and FIGS. 7A, 7B, 7C, and 7D are diagrams illustrating a method of manufacturing a semiconductor device in accordance with an embodiment of the present disclosure. Hereinbelow, repetitive explanation will be omitted if deemed redundant.

Referring to FIGS. 3A, 3B, 3C, and 3D, a stack ST is formed. The stack ST may include stacked layers 20. Each of the layers 20 may include at least one first material layer 21 and at least one second material layer 22. The first material layers 21 may be used to form a gate electrode such as a memory cell or a select transistor. The first material layers 21 may include material having a high etch selectivity with respect to the second material layers 22. In an embodiment, the first material layers 21 may include a sacrificial material such as nitride, and the second material layers 22 may include an insulating material such as oxide. In an embodiment, the first material layers 21 may include conductive material such as polysilicon, tungsten, or molybdenum, and the second material layers 22 may include an insulating material such as oxide.

The stack ST may include a cell region and a contact region. The cell region may be a region in which memory strings including stacked memory cells are located. The contact region may be a region in which an interconnection structure for applying a bias to gate electrodes of the stacked memory cells is located. FIGS. 3A, 3B, 3C, and 3D may illustrate the contact region of the stack ST.

Thereafter, a preliminary stepped structure P_S is formed by patterning the stack ST, wherein the preliminary stepped structure P_S may include a stepped surface SS rising or falling in the first direction I. The preliminary stepped structure P_S may include stepped surfaces SS facing in the first direction I. The facing stepped surfaces SS may have a symmetrical shape or an asymmetrical shape.

The preliminary stepped structure P_S may be formed by patterning the first sub-stack SST1. The preliminary stepped structure P_S may be located at the first level LV1. The preliminary stepped structure P_S may be formed through an etching process using a mask pattern. The preliminary stepped structure P_S may be formed by alternately repeating a process of etching the stack ST using a mask pattern as an etching barrier and a process of reducing the mask pattern.

A plurality of preliminary stepped structures P_S may be arranged in the first direction I. Each of the preliminary stepped structures P_S may be extended in the second direction II. A non-stepped region NSR may be located between the preliminary stepped structures P_S which are adjacent in the first direction I.

Referring to FIGS. 4A, 4B, 4C, and 4D, the preliminary stepped structure P_S is etched to form first stepped structures S11 to S15, second stepped structures S21 to S25, and openings OP. The openings OP may be located between the first stepped structures S11 to S15 and the second stepped structure S21 to S25. Also, the openings OP may be located between non-stepped regions NSR. The first stepped structures S11 to S15 and the second stepped structures S21 to S25 may be located at the first level LV1. The first stepped structures S11 to S15 and the second stepped structures S21 to S25 may be located at substantially the same level.

A first sidewall SW1 and a second sidewall SW2 may be defined by the opening OP. The first sidewall SW1 may include sidewalls of the first stepped structures S11 to S15. The first sidewall SW1 may be extended in the third direction III from the sidewalls of the first stepped structures S11 to S15. The second sidewall SW2 may include sidewalls of the second stepped structures S21 to S25. The second sidewall SW2 may be extended in the third direction III from the sidewalls of the second stepped structures S21 to S25.

Referring to FIGS. 5A, 5B, 5C, and 5D, a passivation layer 23 filling the opening OP is formed. The passivation layer 23 may cover the first sidewall SW1 (see FIG. 1B). The passivation layer 23 may be formed to cover the first stepped structures S11 to S15 and expose the second stepped structures S21 to 25. The passivation layer 23 may cover the non-stepped region NSR.

The passivation layer 23 may include material having a high etch selectivity with respect to the stack ST. In an embodiment, the passivation layer 23 may include a photo resist.

Referring to FIGS. 6A, 6B, 6C, and 6D, third stepped structures S31 to S35 are formed by etching the second stepped structures S21 to S25 using the passivation layer 23 as an etching barrier. The third stepped structures S31 to S35 may be formed by etching the stack ST to transfer the second stepped structures S21 to S25 to the lower portion of the stack ST. The third stepped structures S31 to S35 may be located at a level lower than the first level LV1. In an embodiment, the first stepped structures S11 to S15 and the second stepped structures S21 to S25 may be located at the first level LV1 and the third stepped structures S31 to S35 may be located at the second level LV2 lower than the first level LV1.

The third stepped structures S31 to S35 are formed while the opening OP is filled with the passivation layer 23. Thus, the third stepped structures S31 to S35 may be formed while protecting the first sidewall SW1 or the second sidewall SW2 with the passivation layer 23. It is possible to prevent the first sidewall SW1 or the second sidewall SW2 from being damaged in a process of etching the stack ST.

In an embodiment, the third stepped structures S31 to S35 located at different levels may be formed. For example, the third stepped structures S31 to S35 may be located at second to sixth levels LV2 to LV6, respectively. The third stepped structure S31 may be formed on the second sub-stack SST2. The third stepped structure S32 may be formed on the third sub-stack SST3. The third stepped structure S33 may be formed on the fourth sub-stack SST4. The third stepped structure S34 may be formed on the fifth sub-stack SST5. The third stepped structure S35 may be formed on the sixth sub-stack SST6. The arrangement order of the third stepped structures S31 to S35 or the level at which they are formed may be changed.

In order to form the third stepped structures S31 to S35 located at different levels, an additional mask pattern may be formed. The mask pattern may be additionally formed on the stack ST, and the second stepped structures S21 to S25 may be etched using the additional mask pattern and the passivation layer 23 as the etching barrier. By alternately repeating the process of etching the second stepped structures S21 to S25 and the process of reducing the additional mask pattern, the third stepped structures S31 to S35 located at different levels may be formed.

Referring to FIGS. 7A, 7B, 7C, and 7D, the passivation layer 23 is removed. The passivation layer 23 may be selectively etched. Thereby, the stack ST including the first stepped structures S11 to S15, the third stepped structure S31 to S35, and the preliminary stepped structure P_S is exposed.

In the above-described manufacturing method, the first sidewall SW1 and the second sidewall SW2 are first formed through the opening OP before the third stepped structures S31 to S35 are formed. Furthermore, the third stepped structures S31 to S35 are formed while protecting the first sidewall SW1 or the second sidewall SW2 with the passivation layer 23. When the first sidewall SW1 and the second sidewall SW2 are not formed previously, an abnormal structure such as an undercut may be formed between the first stepped structures S11 and the third stepped structures S31 to S35, in the process of forming the third stepped structures S31 to S35. Such an abnormal structure may increase the area of the stepped structure or reduce the area of the pad. In contrast, according to an embodiment of the present disclosure, when the third stepped structures S31 to S35 are formed, the first sidewall SW1 and the second sidewall SW2 may be protected by the passivation layer 23. Therefore, in the process of forming the third stepped structures S31 to S35, the first sidewall SW1 and the second sidewall SW2 may maintain the profile of an etched surface made when the opening OP is formed.

FIGS. 8A, 8B, 8C, and 8D are diagrams illustrating a method of manufacturing a semiconductor device in accordance with an embodiment of the present disclosure. Hereinbelow, repetitive explanation will be omitted if deemed redundant.

Figure 8A:
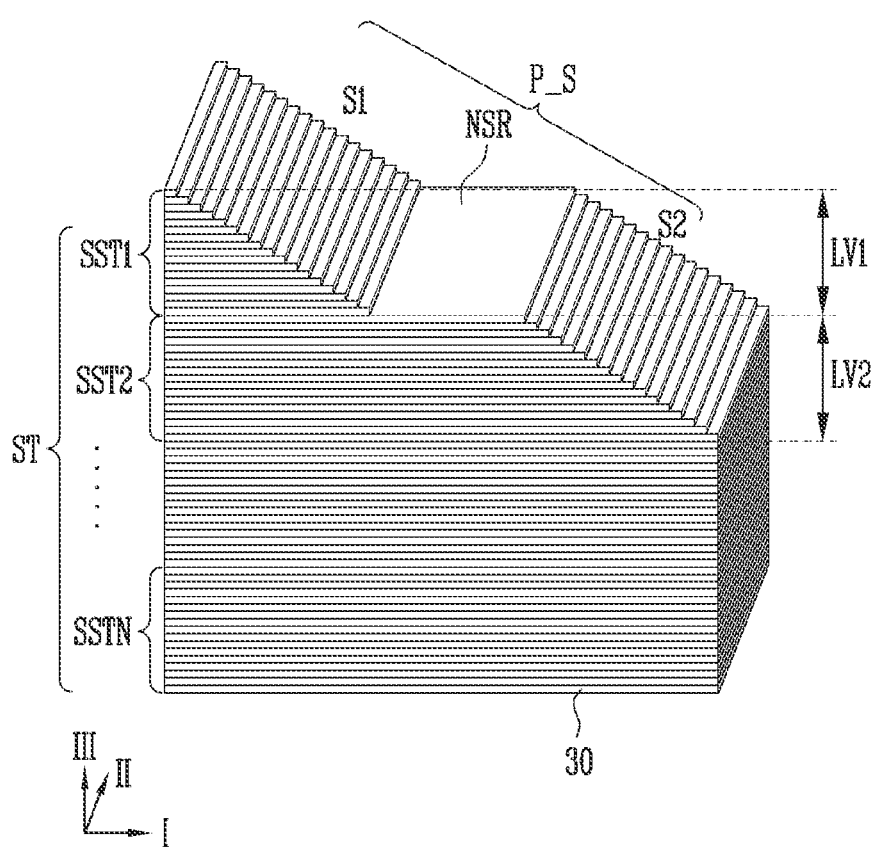
FIGS. 8A, 8B, 8C, and 8D are diagrams illustrating a method of manufacturing a semiconductor device in accordance with an embodiment of the present disclosure.

Referring to FIG. 8A, a stack ST is formed. The stack ST may include first to N-th sub-stacks SST1 to SSTN. The stack ST may include stacked layers 30. Each of the layers 30 may include at least one first material layer and at least one second material layer.

Thereafter, a preliminary stepped structure P_S is formed by patterning the stack ST, wherein the preliminary stepped structure P_S may be formed by patterning the first sub-stack structure SST1 and the second sub-stack material SST2. The preliminary stepped structure P_S may include a first stepped structure S1 and a second stepped structure S2. The first and second stepped structures S1 and S2 may be adjacent to each other in the first direction I. A non-stepped region NSR may be located between the first stepped structure S1 and the second stepped structure S2.

The first stepped structure S1 may be located at the first level LV1, and the second stepped structure S2 may be located at the second level LV2. In an embodiment, for example, the second stepped structure S2 may be located at a level lower than the first stepped structure S1. The first stepped structure S1 may be formed on the first sub-stack SST1. The second stepped structure S2 may be formed on the second sub-stack SST2.

Figure 8B:
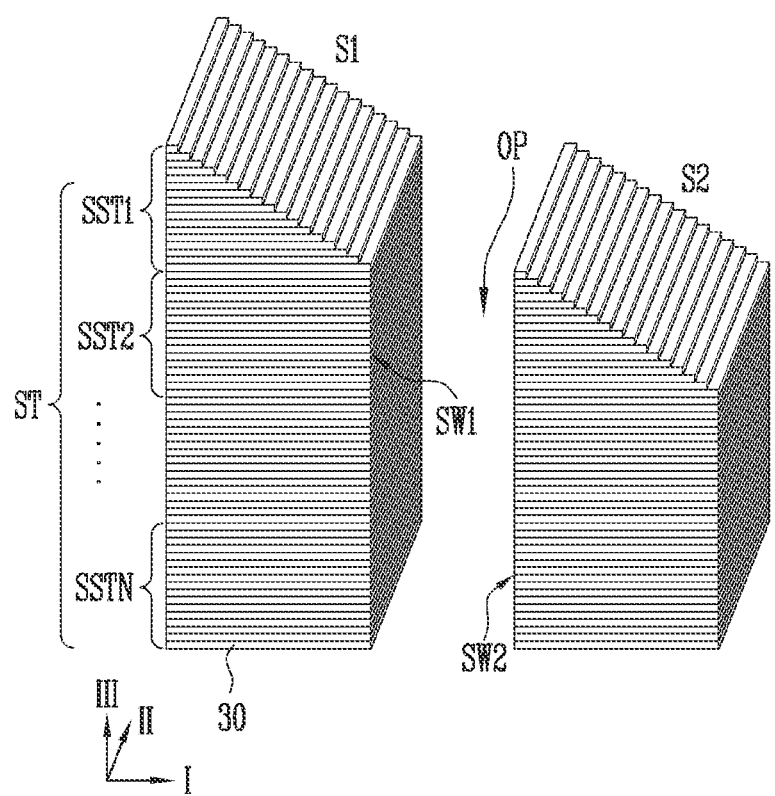

Referring to FIG. 8B, an opening OP passing through the stack ST is formed. The opening OP may be located between the first stepped structures S1 and the second stepped structure S2. The opening OP may be formed by etching the non-stepped region NSR. A first sidewall SW1 and a second sidewall SW2 may be defined by the opening OP. The first sidewall SW1 may include a sidewall of the first stepped structure S1. The second sidewall SW2 may include a sidewall of the second stepped structure S2.

Figure 8C:
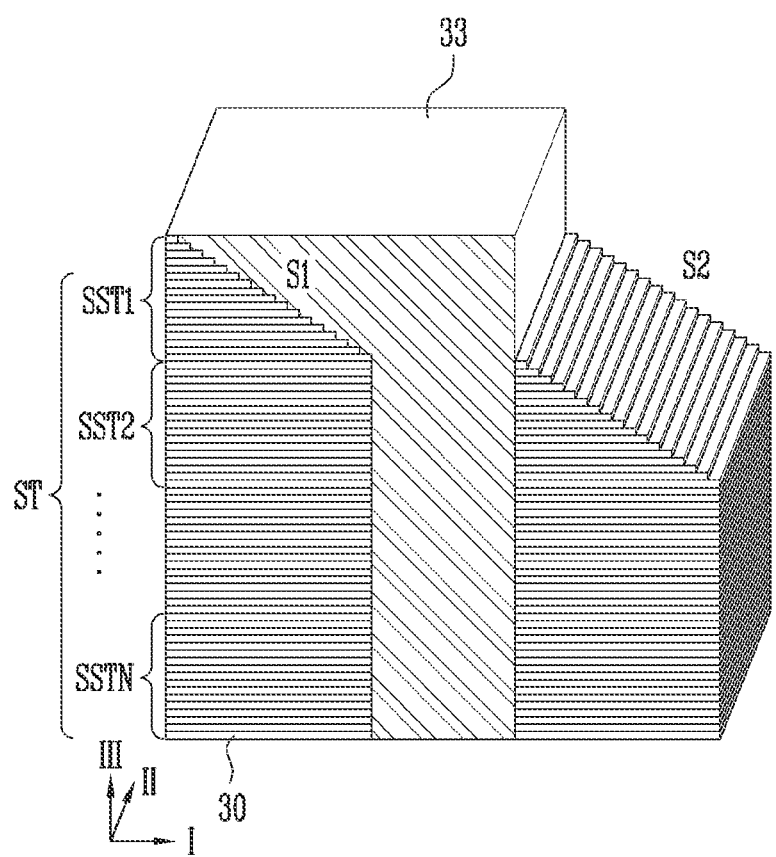

Referring to FIG. 8C, a passivation layer 33 is formed. The passivation layer 33 may be formed to cover the first sidewall SW1. The passivation layer 33 may be formed to cover the first stepped structure S1 and expose the second stepped structure S2.

Figure 8D:
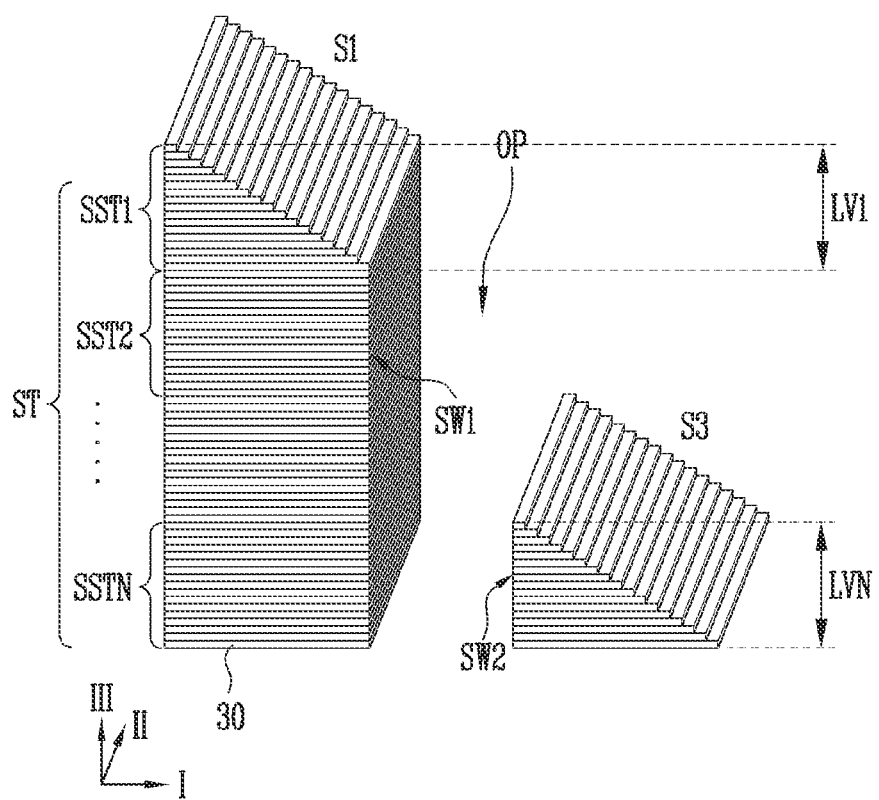

Referring to FIG. 8D, a third stepped structure S3 is formed by etching the second stepped structure S2 using the passivation layer 33 as an etching barrier. The third stepped structure S3 may be formed by etching the stack ST to transfer the second stepped structure S2 to the lower portion of the stack ST. The third stepped structure S3 may be located at a level lower than the second level LV2. In an embodiment, the first stepped structure S1 may be located at the first level LV1, the second stepped structure S2 may be located at the second level LV2 lower than the first level LV1, and the third stepped structure S3 may be located at a third level LV3 lower than the second level LV2. In an embodiment, the second to N-th sub-stacks SST2 to SSTN may be etched to form a third stepped structure S3 positioned at an N-th level LVN. Subsequently, the passivation layer 33 is removed.

In the above-described manufacturing method, the third stepped structure S3 is formed while protecting the first sidewall SW1 or the second sidewall SW2 with the passivation layer 33. Therefore, in a process of forming the third stepped structure S3, it is possible to prevent the first sidewall SW1 and the second sidewall SW2 from being etched or causing an uneven surface.

Figure 9:
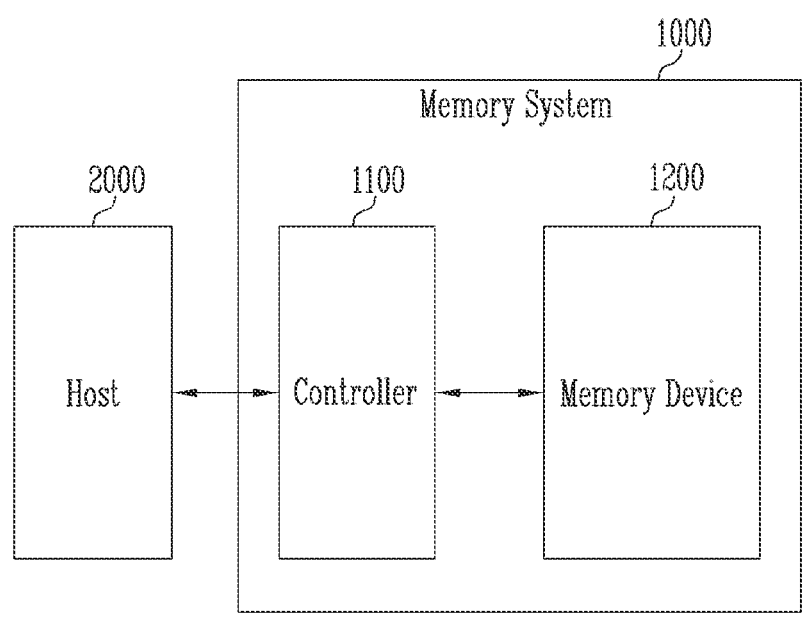
FIG. 9 is a diagram illustrating a memory system in accordance with an embodiment of the present disclosure.

FIG. 9 is a diagram illustrating a memory system in accordance with an embodiment of the present disclosure.

Referring to FIG. 9, the memory system 1000 may include a memory device 1200 configured to store data, and a controller 1100 configured to communicate between the memory device 1200 and a host 2000.

The host 2000 may be a device or system configured to store data in the memory system 1000 or retrieve the data from the memory system 1000. The host 2000 may generate requests for various operations and output the generated requests to the memory system 1000, wherein the requests may include a program request for a program operation, a read request for a read operation, and an erase request for an erase operation. The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), or an integrated drive electronics (IDE) interface.

The host 2000 may include at least one of a computer, a portable digital device, a tablet PC, a digital camera, a digital audio player, a television, a wireless communication device, and a cellular phone, but embodiments of the present disclosure are not limited thereto.

The controller 1100 may control overall operations of the memory system 1000. The controller 1100 may control the memory device 1200 according to the request of the host 2000. The controller 1100 may control the memory device 1200 to perform a program operation, a read operation, an erase operation, and the like according to the request of the host 2000. Alternatively, the controller 1100 may perform a background operation for improving the performance of the memory system 1000 even if there is no request from the host 2000.

The controller 1100 may transmit a control signal and a data signal to the memory device 1200 to control the operation of the memory device 1200. The control signal and the data signal may be transmitted to the memory device 1200 through different input/output lines. The data signal may include a command, an address, or data. The control signal may be used to identify a section in which the data signal is input.

The memory device 1200 may perform the program operation, the read operation, and the erase operation under the control of the controller 1100. The memory device 1200 may be formed of a volatile memory device in which data stored therein is lost when power supply is interrupted, or a non-volatile memory device in which data stored therein is maintained even when power supply is interrupted. The memory device 1200 may have the structure described with reference to FIGS. 1A, 1B, and 1C and FIG. 2. The memory device 1200 may be a semiconductor device manufactured by the manufacturing method described with reference to FIGS. 3A, 3B, 3C, 3D, 4A, 4B, 4C, 4D, 5A, 5B, 5C, 5D, 6A, 6B, 6C, 6D, 7A, 7B, 7C, 7D, 8A, 8B, 8C, and 8D.

Figure 10:
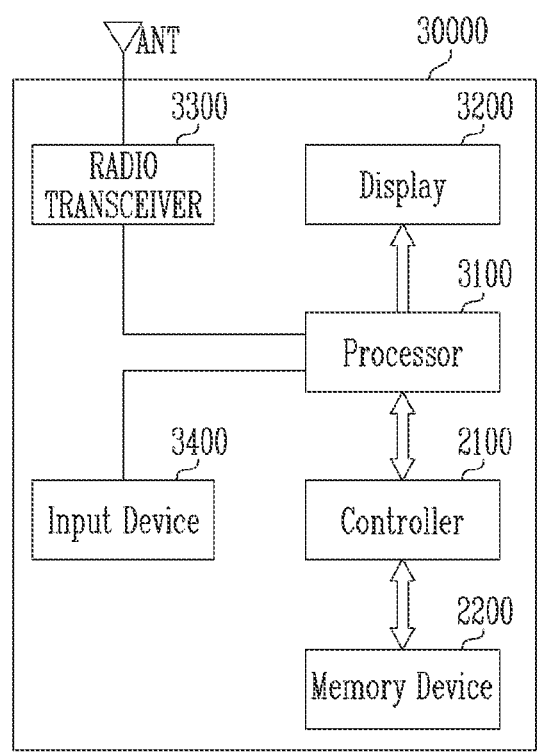
FIG. 10 is a diagram illustrating a memory system in accordance with an embodiment of the present disclosure.

FIG. 10 is a diagram illustrating a memory system in accordance with an embodiment of the present disclosure.

Referring to FIG. 10, the memory system 30000 may be implemented in the form of a cellular phone, a smartphone, a tablet personal computer (PC), a personal digital assistant (PDA) or a wireless communication device. The memory system 30000 may include a memory device 2200 and a controller 2100 configured to control the operation of the memory device 2200.

The controller 2100 may control a data access operation, e.g., a program operation, an erase operation, or a read operation, of the memory device 2200 under the control of a processor 3100.

Data programmed in the memory device 2200 may be outputted through a display 3200 under control of the controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the controller 2100 or the display 3200. The controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the controller 2100, data outputted from the radio transceiver 3300, or data outputted form the input device 3400 is outputted through the display 3200.

In an embodiment, the controller 2100 capable of controlling the operation of the memory device 2200 may be embodied as a part of the processor 3100 or a chip provided separately from the processor 3100.

Figure 11:
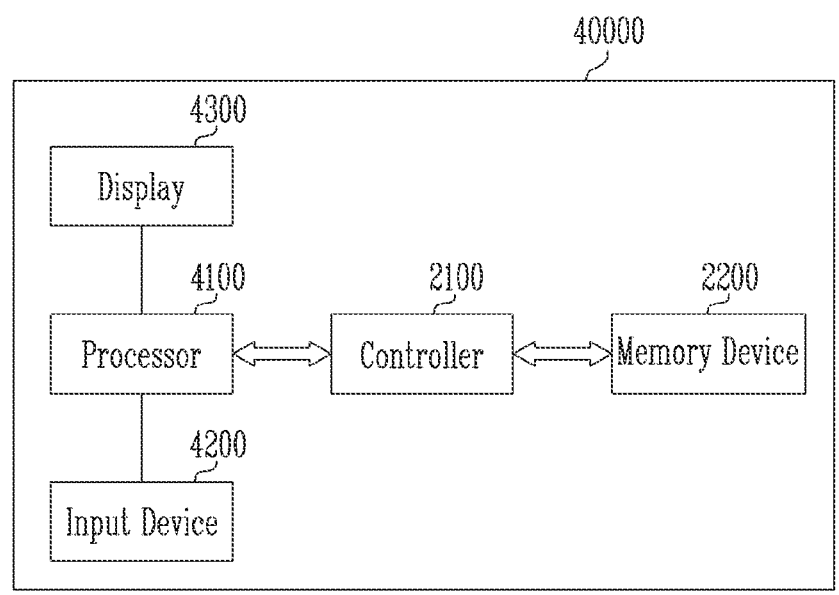
FIG. 11 is a diagram illustrating a memory system in accordance with an embodiment of the present disclosure.

FIG. 11 is a diagram illustrating a memory system in accordance with an embodiment of the present disclosure.

Referring to FIG. 11, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and a controller 2100 configured to control a data processing operation of the memory device 2200.

A processor 4100 may output data stored in the memory device 2200 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the controller 2100. In an embodiment, the controller 2100 capable of controlling the operation of the memory device 2200 may be embodied as a part of the processor 4100 or a chip provided separately from the processor 4100.

Figure 12:
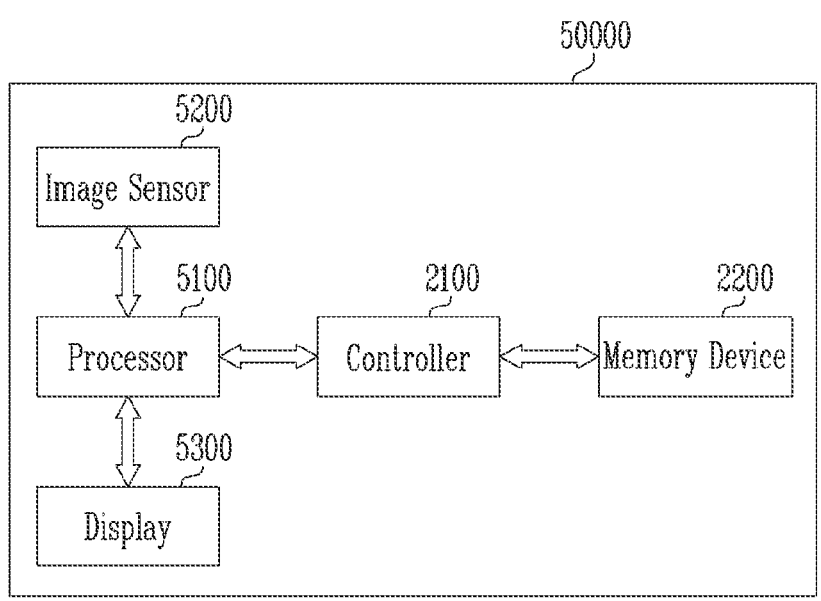
FIG. 12 is a diagram illustrating a memory system in accordance with an embodiment of the present disclosure.

FIG. 12 is a diagram illustrating a memory system in accordance with an embodiment of the present disclosure.

Referring to FIG. 12, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200, and a controller 2100 configured to control a data processing operation, e.g., a program operation, an erase operation, or a read operation, of the memory device 2200.

An image sensor 5200 of the memory system 50000 may convert an optical image into digital signals. The converted digital signals may be transmitted to a processor 5100 or the controller 2100. Under control of the processor 5100, the converted digital signals may be outputted through a display 5300 or stored in the memory device 2200 through the controller 2100. Data stored in the memory device 2200 may be outputted through the display 5300 under the control of the processor 5100 or the controller 2100.

In an embodiment, the controller 2100 capable of controlling the operation of the memory device 2200 may be embodied as a part of the processor 5100 or a chip provided separately from the processor 5100.

Figure 13:
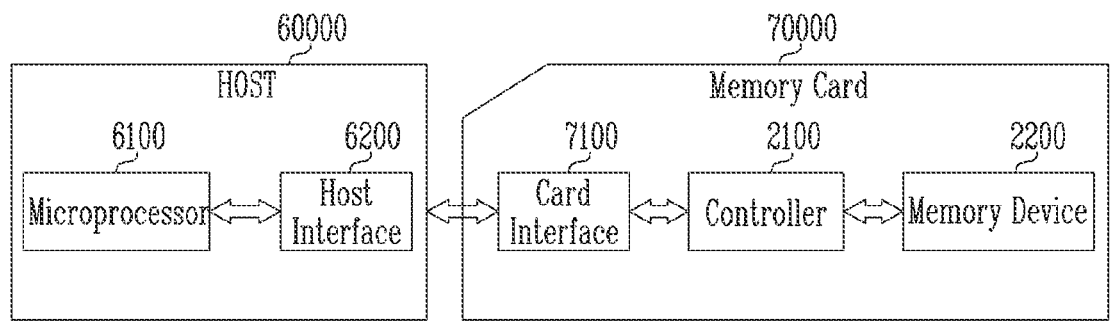
FIG. 13 is a diagram illustrating a memory system in accordance with an embodiment of the present disclosure.

FIG. 13 is a diagram illustrating a memory system in accordance with an embodiment of the present disclosure.

Referring to FIG. 13, the memory system 70000 may be embodied in a memory card or a smart card. The memory system 70000 may include a memory device 2200, a controller 2100, and a card interface 7100.

The controller 2100 may control data exchange between the memory device 2200 and the card interface 7100. For example, in an embodiment, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the controller 2100 under the control of a microprocessor 6100.

By three-dimensionally stacking memory cells, the integration of a semiconductor device may be improved. Furthermore, a semiconductor device which has a stable structure and is improved in reliability may be provided.

What is claimed is:

1. A method of manufacturing a semiconductor device, comprising:
   forming a stack;
   forming a preliminary stepped structure by patterning the stack, the preliminary stepped structure including preliminary stepped surfaces facing each other in a first direction and extended in a second direction crossing the first direction;
   forming a first stepped structure, an opening, and a second stepped structure by etching the preliminary stepped structure;
   forming a passivation layer that fills the opening and covers the first stepped structure; and
   forming a third stepped structure by etching the second stepped structure using the passivation layer as an etching barrier.

2. The method according to claim 1, wherein each of the first stepped structure and the third stepped structure includes stepped surfaces facing in the first direction.

3. The method according to claim 2, wherein a first sidewall of the first stepped structure and a second sidewall of the second stepped structure are defined by the opening, and the first sidewall and the second sidewall face each other.

4. The method according to claim 3, wherein forming the passivation layer comprises forming the passivation layer to cover the first sidewall and the stepped surfaces of the first stepped structure.

5. The method according to claim 1, wherein forming the third stepped structure comprises forming the third stepped structure by transferring the second stepped structure to a lower portion of the stack.

6. The method according to claim 1, wherein the first stepped structure and the second stepped structure are located at a first level, and the third stepped structure is located at a second level lower than the first level.

7. The method according to claim 3, wherein the first sidewall is protected by the passivation layer when the third stepped structure is formed.

8. The method according to claim 1, wherein the passivation layer is removed after the third stepped structure is formed.

* * * * *